United States Patent
Knott et al.

(10) Patent No.: US 8,149,080 B2
(45) Date of Patent: Apr. 3, 2012

(54) INTEGRATED CIRCUIT INCLUDING INDUCTIVE DEVICE AND FERROMAGNETIC MATERIAL

(75) Inventors: Bernhard Knott, Neumarkt (DE); Josef Höglauer, München (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 178 days.

(21) Appl. No.: 11/860,848

(22) Filed: Sep. 25, 2007

(65) Prior Publication Data

US 2009/0079529 A1   Mar. 26, 2009

(51) Int. Cl.
*H01F 5/00* (2006.01)
*H01F 27/28* (2006.01)
*H01L 27/08* (2006.01)

(52) U.S. Cl. ............... 336/200; 336/223; 257/531
(58) Field of Classification Search ............ 336/200, 336/232, 83; 257/531
See application file for complete search history.

(56) References Cited

U.S. PATENT DOCUMENTS

| | | | |
|---|---|---|---|
| 5,465,475 A * | 11/1995 | Kinoshita et al. ......... | 29/603.16 |
| 5,877,533 A * | 3/1999 | Arai et al. ................. | 257/350 |
| 5,884,990 A | 3/1999 | Burghartz et al. | |
| 6,191,468 B1 * | 2/2001 | Forbes et al. .............. | 257/531 |
| 7,414,507 B2 * | 8/2008 | Giandalia et al. .......... | 336/200 |
| 7,474,189 B1 * | 1/2009 | Dening et al. ............. | 336/200 |
| 2003/0112110 A1 * | 6/2003 | Pavier ....................... | 336/96 |
| 2003/0231093 A1 | 12/2003 | Hsu et al. | |
| 2005/0062575 A1 * | 3/2005 | Gardner ..................... | 336/200 |
| 2006/0275960 A1 * | 12/2006 | Yamada et al. ............. | 438/149 |

FOREIGN PATENT DOCUMENTS

| | | |
|---|---|---|
| DE | 4117878 A1 | 12/1991 |
| EP | 1536433 | 1/2005 |
| EP | 1536433 A1 | 1/2005 |
| GB | 2379558 | 3/2003 |
| GB | 2379558 A * | 3/2003 |
| JP | 63220504 | 9/1988 |
| JP | 05082736 A * | 4/1993 |
| JP | 08017656 | 1/1996 |

OTHER PUBLICATIONS

English translation of JP05082736A.*
English translation of GB2379558.*

* cited by examiner

*Primary Examiner* — Elvin G Enad
*Assistant Examiner* — Ronald Hinson
(74) *Attorney, Agent, or Firm* — Dicke, Billig & Czaja, PLLC

(57) ABSTRACT

An integrated circuit includes a substrate and an inductive device on a first side of the substrate. The integrated circuit includes a first ferromagnetic material on a second side of the substrate opposite the first side.

25 Claims, 3 Drawing Sheets

INTEGRATED CIRCUIT INCLUDING INDUCTIVE DEVICE AND FERROMAGNETIC MATERIAL

BACKGROUND

Inductive devices, such as transformers and inductors provided by coils are often included in small scale, medium scale, or very large scale integration (VLSI) circuits. Typically, inductive devices integrated in these circuits use large coil diameters to obtain a good quality factor (i.e., Q-factor). A good Q-factor is especially important for radio frequency (RF) technology applications. Large diameter coils, however, typically use a large percentage of the available substrate area of an integrated circuit and therefore increase production costs.

Concentric coils are typically located in parallel to a substrate surface. The coils are fabricated in back end of line (BEOL) processing during a metallization process using suitable metallization material. Typically, the coils may consume 50% or more of the total chip area. In addition, the inductivities achieved from the coils are usually not suitable for applications in which the coils will be used not only for signal transmission but also for power transmission.

For these and other reasons, there is a need for the present invention.

SUMMARY

One embodiment provides an integrated circuit. The integrated circuit includes a substrate and an inductive device on a first side of the substrate. The integrated circuit includes a first ferromagnetic material on a second side of the substrate opposite the first side.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
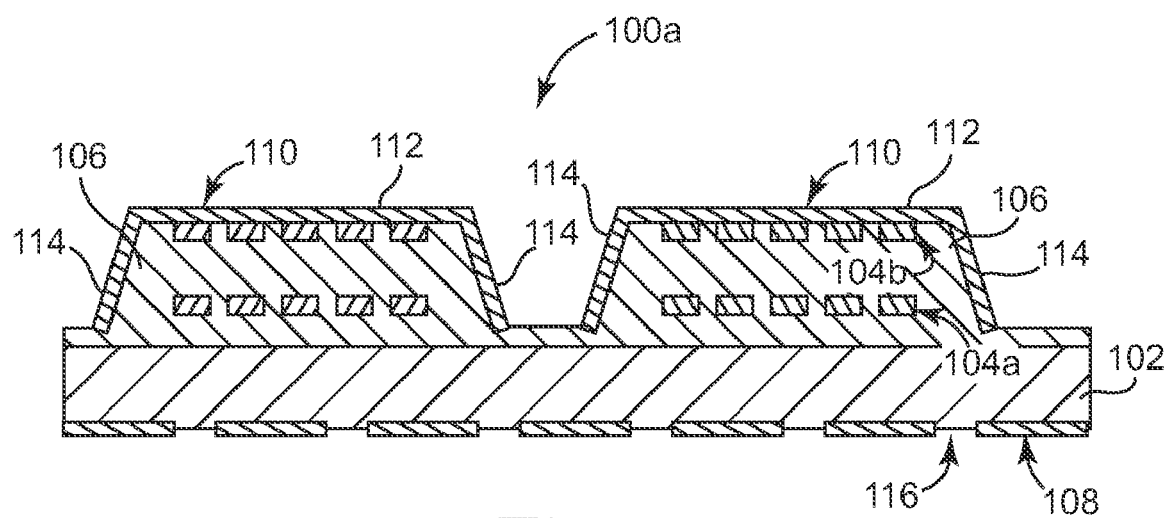
FIG. 1 illustrates a cross-sectional view of one embodiment of an integrated circuit including an inductive device encased in ferromagnetic material.

FIG. 1 illustrates a cross-sectional view of one embodiment of an integrated circuit 100a. Integrated circuit 100a includes a substrate 102, inductive devices 104a and 104b, dielectric material 106, first ferromagnetic material 108, and second ferromagnetic material 110. In other embodiments, integrated circuit 100a includes any suitable number of inductive devices.

First ferromagnetic material 108 and second ferromagnetic material 110 partially or fully encase or enclose inductive devices 104a and 104b. The ferromagnetic material can be applied using suitable semiconductor processing techniques during front end of line (FEOL) processing and/or back end of line (BEOL) processing. The ferromagnetic material can be positioned above inductive devices 104a and 104b, below inductive devices 104a and 104b, and/or on the sides (inner and outer) of inductive devices 104a and 104b.

First ferromagnetic material 108 and second ferromagnetic material 110 confine the magnetic flux inside inductive devices 104a and 104b. The confining of the magnetic flux inside inductive devices 104a and 104b reduces energy dissipation from inductive devices 104a and 104b due to leakage fields and magnetic coupling to silicon substrate 102. By reducing the energy dissipation in this way, the quality factor (i.e., Q-factor) of inductive devices 104a and 104b is increased. By increasing the Q-factor of inductive devices 104a and 104b, inductive devices 104a and 104b can be used for both signal transmission and power transmission.

Inductive devices 104a and 104b are formed in metallization layers on substrate 102 using suitable metallization materials. In one embodiment, inductive devices 104a and 104b are concentric coils providing inductors, transformers, or other suitable devices. Dielectric material 106 surrounds the metal material forming inductive devices 104a and 104b. In one embodiment, substrate 102 is a silicon substrate. The thickness of substrate 102 is less than the diameter of inductive devices 104a and 104b. In one embodiment, grinding is used to reduce the thickness of substrate 102 to between approximately 60-100 µm.

Ferromagnetic material, such as Co, Fe, Ni, or other suitable ferromagnetic material is deposited on the backside of substrate 102. The ferromagnetic material is structured using suitable lithography processes to provide gaps 116 between portions of first ferromagnetic material 108. Gaps 116 between portions of first ferromagnetic material 108 are provided to prevent eddy currents. Because silicon substrate 102 has a low electrical conductivity, magnetic coupling of the magnetic field of inductive devices 104a and 104b into substrate 102 is low. Therefore, first ferromagnetic material 108 shields the magnetic field of inductive devices 104a and 104b.

Ferromagnetic material, such as Co, Fe, Ni, or other suitable ferromagnetic material is deposited on the top and sides of inductive devices 104a and 104b. In one embodiment, the ferromagnetic material is structured using suitable lithography processes to provide second ferromagnetic material 110. Second ferromagnetic material 110 includes first portions 112 and second portions 114. First portions 112 are provided on top of inductive devices 104a and 104b. Second portions 114 are provided on the outer sidewalls of dielectric material 106 surrounding inductive devices 104a and 104b. In one embodiment, second portions 114 are also provided on the inner sidewalls of dielectric material 106 surrounding inductive devices 104a and 104b. In one embodiment, the sidewalls of dielectric material 106 surrounding inductive devices 104a and 104b are perpendicular to first portions 112. In another embodiment, the sidewalls of dielectric material 106 surrounding inductive devices 104a and 104b are sloped.

Figure 2:
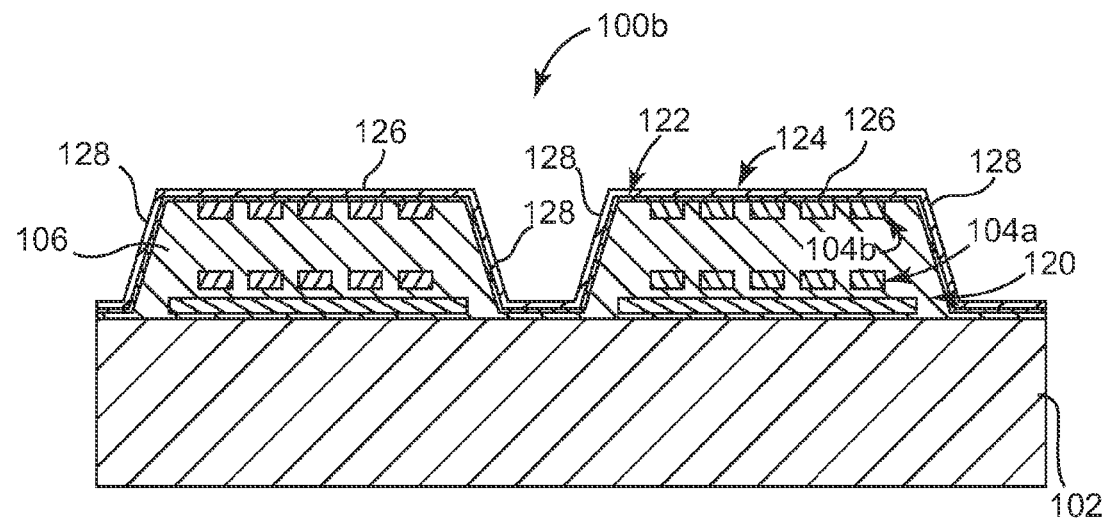
FIG. 2 illustrates a cross-sectional view of another embodiment of an integrated circuit including an inductive device encased in ferromagnetic material.

FIG. 2 illustrates a cross-sectional view of another embodiment of an integrated circuit 100b. Integrated circuit 100b includes substrate 102, first ferromagnetic material 120, inductive devices 104a and 104b, dielectric material 106, and second ferromagnetic material 122 and 124. In this embodiment, first ferromagnetic material 120 is provided between inductive devices 104a and 104b and substrate 102. First ferromagnetic material 120 is formed in a metallization layer on substrate 102. Since first ferromagnetic material 120 is between inductive devices 104a and 104b and substrate 102, in this embodiment the thickness of substrate 102 can be greater than the diameter of inductive devices 104a and 104b.

Second ferromagnetic material 122 is printed over inductive devices 104a and 104b. In one embodiment, second ferromagnetic material 122 is printed using an inkjet printer or other suitable printer. Next, a galvanic process is used to optimize or enhance the printed ferromagnetic material 122 and to provide ferromagnetic material 124. The galvanic process is selected to provide a combination of ferromagnetic material 122 and 124 providing desired ferromagnetic properties. Ferromagnetic materials 122 and 124 include first portions 126 and second portions 128. First portions 126 are provided on top of inductive devices 104a and 104b. Second portions 128 are provided on the outer sidewalls of dielectric material 106 surrounding inductive devices 104a and 104b. In one embodiment, second portions 128 are also provided on the inner sidewalls of dielectric material 106 surrounding inductive devices 104a and 104b. In this embodiment, the sidewalls of dielectric material 106 surrounding inductive devices 104a and 104b are sloped such that a printer can print ferromagnetic material 122 on the sidewalls. First ferromagnetic material 120 and second ferromagnetic material 122 and 124 provide a similar function as first ferromagnetic material 108 and second ferromagnetic material 110 previously described and illustrated with reference to FIG. 1.

Figure 3:
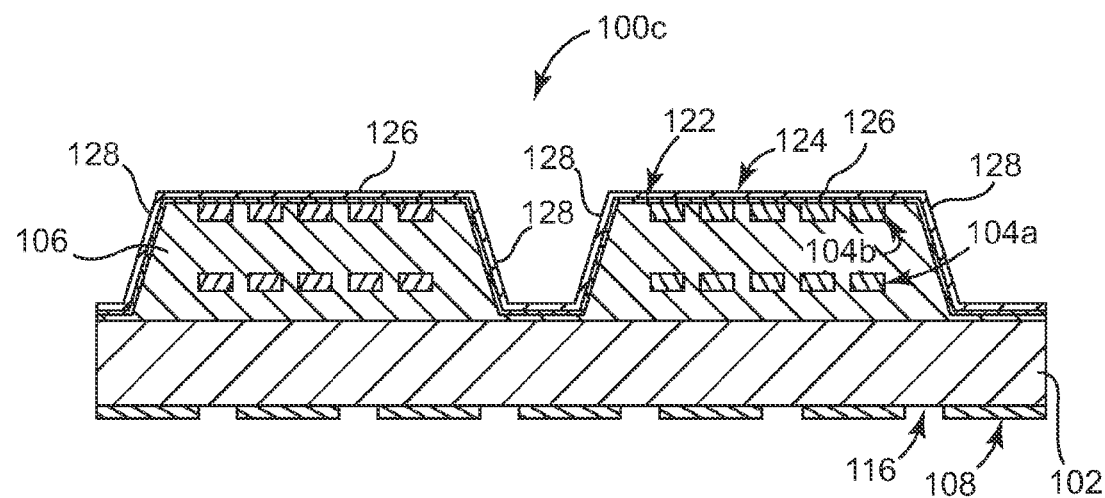
FIG. 3 illustrates a cross-sectional view of another embodiment of an integrated circuit including an inductive device encased in ferromagnetic material.

FIG. 3 illustrates a cross-sectional view of another embodiment of an integrated circuit 100c. Integrated circuit 100c is similar to integrated circuit 100b previously described and illustrated with reference to FIG. 2, except that in integrated circuit 100c first ferromagnetic material 120 is replaced with first ferromagnetic material 108. First ferromagnetic material 108 is deposited and structured on the backside of wafer 102 as previously described and illustrated with reference to FIG. 1. First ferromagnetic material 108 and second ferromagnetic material 122 and 124 provide a similar function as first ferromagnetic material 108 and second ferromagnetic material 110 previously described and illustrated with reference to FIG. 1.

Figure 4:
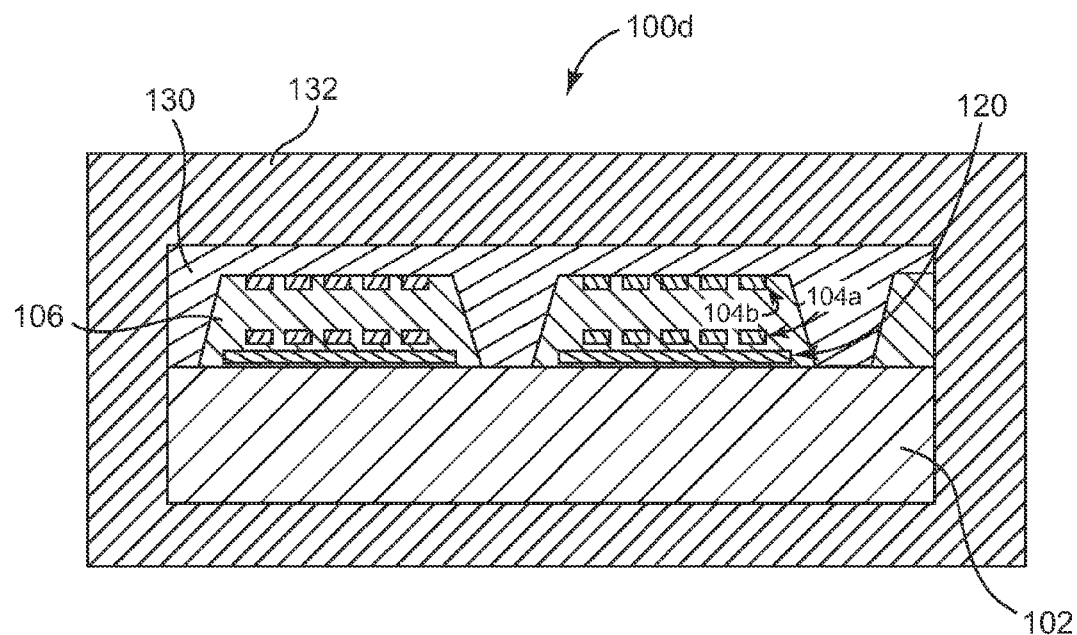
FIG. 4 illustrates a cross-sectional view of another embodiment of an integrated circuit including an inductive device encased in ferromagnetic material.

FIG. 4 illustrates a cross-sectional view of another embodiment of an integrated circuit 100d. Integrated circuit 100d includes substrate 102, first ferromagnetic material 120, inductive devices 104a and 104b, a ferromagnetic mold material 130, and an encapsulating mold material 132. In this embodiment, first ferromagnetic material 120 is provided between inductive devices 104a and 104b and substrate 102. First ferromagnetic material 120 is formed in a metallization layer on substrate 102. Since first ferromagnetic material 120 is between inductive devices 104a and 104b and substrate 102, in this embodiment the thickness of substrate 102 can be greater than the diameter of inductive devices 104a and 104b.

In addition, inductive devices 104a and 104b are encased or enclosed with ferromagnetic mold material 130. In one embodiment, ferromagnetic mold material 130 includes a suitable molding compound mixed with ferrite or other suitable material to provide a ferromagnetic mold material. The ferromagnetic mold material is applied over the top and sidewalls of dielectric material 106 and inductive devices 104a and 104b using a suitable molding process. A suitable non-ferromagnetic encapsulation mold material 132 encapsulates ferromagnetic mold material 130 and substrate 102. First ferromagnetic material 120 and ferromagnetic mold material 130 provide a similar function as first ferromagnetic material 108 and second ferromagnetic material 110 previously described and illustrated with reference to FIG. 1.

Figure 5:
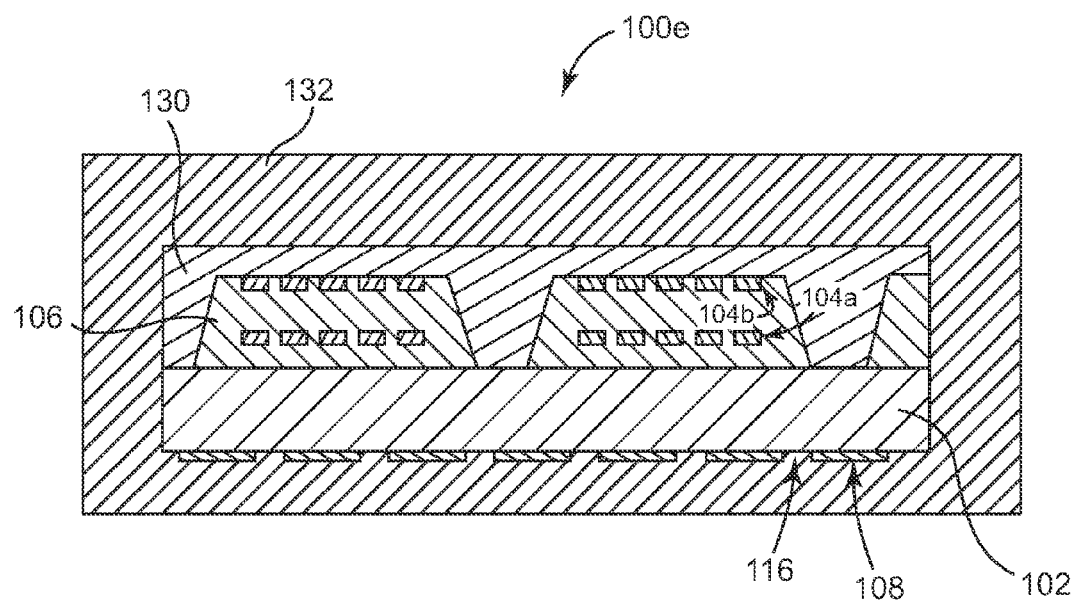
FIG. 5 illustrates a cross-sectional view of another embodiment of an integrated circuit including an inductive device encased in ferromagnetic material.

FIG. 5 illustrates a cross-sectional view of another embodiment of an integrated circuit 100e. Integrated circuit e is similar to integrated circuit 100d previously described and illustrated with reference to FIG. 4, except that in integrated circuit e first ferromagnetic material 120 is replaced with first ferromagnetic material 108. First ferromagnetic material 108 is deposited and structured on the backside of wafer 102 as previously described and illustrated with reference to FIG. 1. First ferromagnetic material 108 and ferromagnetic mold material 130 provide a similar function as first ferromagnetic material 108 and second ferromagnetic material 110 previously described and illustrated with reference to FIG. 1.

Embodiments provide inductive devices embedded in ferromagnetic material. The ferromagnetic material shields the inductive devices thereby increasing the inductivities and Q-factors of the inductive devices. By increasing the Q-factors of the inductive devices, the inductive devices can be used for both signal transmission and power transmission in small scale, medium scale, or very large scale integration circuits.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a substrate comprising a circuit;
    an inductive device on a first side of the substrate;
    first ferromagnetic material on a second side of the substrate opposite the first side of the substrate, the first ferromagnetic material structured to provide gaps between portions of the first ferromagnetic material; and
    second ferromagnetic material over a first side and a second side of the inductive device, the first side of the inductive device directly contacting the second side of the inductive device,
    wherein the second ferromagnetic material over the first side directly contacts the second ferromagnetic material over the second side at an angle greater than or equal to 90° and less than 180°.

2. The integrated circuit of claim 1, wherein the substrate comprises a semiconductor wafer.

3. The integrated circuit of claim 1, wherein the second ferromagnetic material comprises a printed ferromagnetic material.

4. The integrated circuit of claim 3, wherein the second ferromagnetic material comprises a galvanic process enhanced ferromagnetic material.

5. The integrated circuit of claim 1, wherein the second ferromagnetic material comprises ferromagnetic mold material encasing the inductive device.

6. The integrated circuit of claim 1, wherein the inductive device comprises an inductor configured to transmit power.

7. An integrated circuit comprising:
a substrate comprising a circuit;
a first inductive device on a first side of the substrate;
a second inductive device over the first inductive device;
a dielectric material directly contacting the first inductive device and the second inductive device, the dielectric material extending from the first inductive device to the second inductive device; and
first ferromagnetic material printed over a first side and a second side of the first and second inductive devices, the first side of the inductive devices directly contacting the second side of the inductive devices,
wherein first ferromagnetic material over the first side directly contacts the first ferromagnetic material over the second side at an angle greater than or equal to 90° and less than 180°.

8. The integrated circuit of claim 7, wherein the first ferromagnetic material comprises a galvanic process enhanced ferromagnetic material.

9. The integrated circuit of claim 7, further comprising:
second ferromagnetic material between the first inductive device and the substrate.

10. The integrated circuit of claim 7, further comprising:
second ferromagnetic material on a second side of the substrate opposite the first side.

11. An integrated circuit comprising:
a substrate comprising a circuit;
a first inductive device on a first side of the substrate;
a second inductive device over the first inductive device;
a dielectric material directly contacting the first inductive device and the second inductive device, the dielectric material extending from the first inductive device to the second inductive device; and
ferromagnetic mold material encasing a first side and a second side of the first and second inductive devices, the first side of the inductive devices directly contacting the second side of the inductive devices,
wherein the mold material encasing the first side directly contacts the mold material encasing the second side at an angle greater than or equal to 90° and less than 180°.

12. The integrated circuit of claim 11, further comprising:
ferromagnetic material between the first inductive device and the substrate.

13. The integrated circuit of claim 11, further comprising:
ferromagnetic material on a second side of the substrate opposite the first side.

14. The integrated circuit of claim 11, further comprising:
encapsulation mold material encasing the ferromagnetic mold material and the substrate.

15. A method for fabricating an integrated circuit, the method comprising:
providing a substrate comprising a circuit;
fabricating an inductive device on a first side of the substrate;
providing first ferromagnetic material on a second side of the substrate opposite the first side of the substrate;
structuring the first ferromagnetic material to provide gaps between portions of the first ferromagnetic material; and
providing second ferromagnetic material over a first side and a second side of the inductive device, the first side of the inductive device directly contacting the second side of the inductive device,
wherein the second ferromagnetic material over the first side directly contacts the second ferromagnetic material over the second side at an angle greater than or equal to 90° and less than 180°.

16. The method of claim 15, wherein the substrate comprises a semiconductor wafer.

17. The method of claim 15, wherein providing the second ferromagnetic material comprises printing the second ferromagnetic material over the inductive device.

18. The method of claim 17, further comprising:
enhancing the second ferromagnetic material using a galvanic process.

19. The method of claim 15, wherein the second ferromagnetic material comprises ferromagnetic mold material.

20. The method of claim 15, further comprising:
grinding the substrate to reduce a thickness of the substrate to between 60-100 µm.

21. A method for fabricating an integrated circuit, the method comprising:
providing a substrate comprising a circuit;
fabricating a first inductive device on a first side of the substrate;
fabricating a second inductive device over the first inductive device;
providing a dielectric material directly contacting the first inductive device and the second inductive device, the dielectric material extending from the first inductive device to the second inductive device;
providing first ferromagnetic material between the first inductive device and the substrate; and
covering a first side and a second side of the first and second inductive devices with second ferromagnetic material, the first side of the inductive devices directly contacting the second side of the inductive devices,
wherein the second ferromagnetic material over the first side directly contacts the second ferromagnetic material over the second side at an angle greater than or equal to 90° and less than 180°.

22. The method of claim 21, wherein covering the inductive devices with second ferromagnetic material comprises printing the second ferromagnetic material over the inductive devices.

23. The method of claim 22, further comprising:
enhancing the second ferromagnetic material using a galvanic process.

24. The method of claim 21, wherein covering the inductive devices with second ferromagnetic material comprises encasing the inductive devices in a ferromagnetic mold material.

25. The method of claim 24, further comprising:
encasing the ferromagnetic mold material and the substrate within encapsulation mold material.

* * * * *

UNITED STATES PATENT AND TRADEMARK OFFICE
CERTIFICATE OF CORRECTION

| | | |
|---|---|---|
| PATENT NO. | : 8,149,080 B2 | |
| APPLICATION NO. | : 11/860848 | |
| DATED | : April 3, 2012 | |
| INVENTOR(S) | : Bernhard Knott et al. | |

It is certified that error appears in the above-identified patent and that said Letters Patent is hereby corrected as shown below:

On cover page below "FOREIGN PATENT DOCUMENTS" insert
--KR  2002044311  6/2002--.

Signed and Sealed this
Seventeenth Day of July, 2012

David J. Kappos
*Director of the United States Patent and Trademark Office*